United States Patent [19]

Sadigh-Behzadi

[11] Patent Number: 4,702,706
[45] Date of Patent: Oct. 27, 1987

[54] ELECTRICAL CONNECTING DEVICE INCLUDING SOCKET THEREFOR

[75] Inventor: Amir-Akbar Sadigh-Behzadi, Van Nuys, Calif.

[73] Assignee: Thomas & Betts Corporation, Raritan, N.J.

[21] Appl. No.: 840,279

[22] Filed: Mar. 17, 1986

Related U.S. Application Data

[63] Continuation of Ser. No. 523,802, Aug. 16, 1983, abandoned.

[51] Int. Cl.$^4$ ............................................. H01R 23/02
[52] U.S. Cl. ..................................... 439/69; 439/387; 439/525; 439/654
[58] Field of Search .......... 339/17 CF, 154 R, 154 A, 339/156 R, 176 M, 151 R, 153, 155 R, 157 R, 159 R, 95 D, 258 R, 258 P, 151 A, 151 B, 151 C, 151 M

[56] References Cited

U.S. PATENT DOCUMENTS 3,019,406  1/1962  Slater ................................ 339/95 D
3,160,459  12/1964  Greco et al. ......................... 339/176
3,393,397  7/1968  Manichl ............................. 339/95 D Primary Examiner—Gil Weidenfeld
Assistant Examiner—Gary F. Paumen
Attorney, Agent, or Firm—Robert M. Rodrick; Salvatore J. Abbruzzese

[57] ABSTRACT

An electrical connecting device for disengageable connection to conductors of an electric component comprises an integrated circuit (IC) package having a plurality of leads in dual-in-line configuration. A socket included in such device comprises an insulative housing and first and second pluralities of contacts supported thereon arranged in laterally spaced, longitudinally corresponding positions. Each of the contacts has a first end portion selectively plated, with gold for example, for detachable connection to a conductor of the electric component. A second end of the contacts is selectively tin-plated and soldered to the leads of the IC package. The second end portion of each of the contacts is formed to have thereon at least two laterally spaced contact members, thereby providing for selective securement thereto of IC packages having different laterally spaced leads.

7 Claims, 6 Drawing Figures

ELECTRICAL CONNECTING DEVICE INCLUDING SOCKET THEREFOR

This is a continuation of application Ser. No. 523,802, filed Aug. 16, 1983, now abandoned.

FIELD OF THE INVENTION

This invention relates to an electrical connecting device for disengageably connecting an electric package to a printed circuit board or the like and more particularly to a socket for use in such device.

BACKGROUND OF THE INVENTION

The use of electronic components and other electric packages in miniature and microminiature circuitry has become well-known and commercially successful. The interconnection of integrated circuits (ICs) and printed circuit boards (PCBs) is commonly required in such circuitry. One means of interconnection is to directly "hard" connect by soldering the leads of an IC to the conductive traces of a PCB or to metallized apertures provided therein. As flexibility in repair and replacement is minimal in soldering the IC to the PCB, various techniques and connecting devices have been developed wherein carriers or intermediate sockets provide removable connection of the IC to the PCB. In these devices, as shown, for example, in U.S. Pat. Nos. 3,621,157; 3,993,381; 4,060,296; and 4,072,380, the leads of the IC are typically disengageably connected by pressure to the contacts of a socket or carrier by means of spring bias arrangements or camming structures and the socket or carrier contacts are then in turn soldered to the PCB. As the leads of commercially available ICs are typically provided with leads having tin thereon, a problem in meeting environmental standards is commonly faced. A tin interface, and especially a tin-tin interface, in a pressure contact often results in a fritting or corrosive deterioration. Accordingly, while the current trend is toward the use of intermediate sockets because replacement and service are made easier and faster and also because the relatively soft leads of the IC are protected by the intermediate sockets, further consideration is to be given to the reliability aspects of the IC and PCB interconnections. In addition, as the density of ICs in very large scale integrated circuitry continues to increase, the judicious use of space and size in interconecting devices must be contemplated.

SUMMARY OF THE INVENTION

It is an object of the present invention to provide an improved electrical connecting device in meeting the desired electrical reliability aspects and in overcoming the difficulties of the prior art.

It is a further object of the present invention to provide a socket for receiving and connecting to an integrated circuit and wherein the socket is readily disengageable with conductors on an electric component, such as a PCB or the like.

In accordance with the invention, an electrical connecting device for disengageable connection to conductors of an electric component comprises an electric package including a housing and a plurality of leads extending therefrom. A socket is included that has an insulative body and a plurality of contacts supported thereon. Each of the contacts has a first end portion for disengageable electrical engagement with a conductor of the electrical component and a second end portion that is in non-detachable securement with a lead of the electric package. The second end portion includes means for selective securement of a package lead thereto.

In a particularly preferred arrangement, the leads of the electric package extend from the housing and are soldered to the socket contacts, the socket contacts being covered in part by a suitable material such as gold, to facilitate disengageable connection to the conductors of the electric component. In addition, the socket contacts, arranged in two laterally spaced, longitudinally extending rows, are each formed with at least two laterally spaced contact members providing the selectivity in the securement thereto of packages of differently spaced leads.

DETAILED DESCRIPTION OF THE PREFERRED EMBODIMENT

Figure 1:
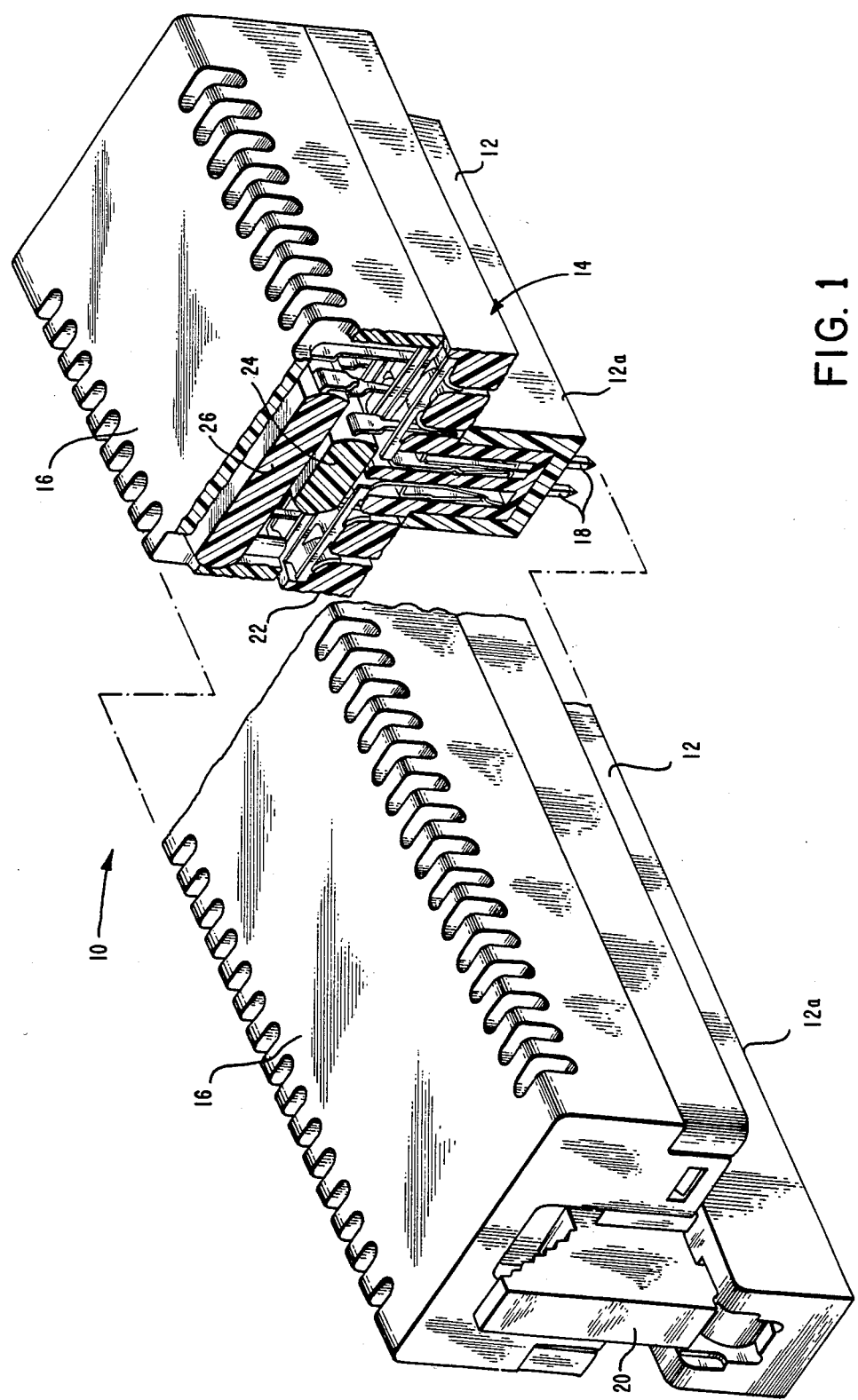
FIG. 1 is a perspective top view of a connector module embodying the present invention and broken away to reveal particular details thereof.

Referring now to the drawing, there is shown in FIG. 1 an electrical connector module 10 embodying the features of the present invention. Connector module 10 comprises a header 12, a socket assembly 14 and an insulative cover 16. The header 12 includes an elongate insulative base 12a supporting a plurality of conductive pins 18 arranged in two laterally spaced, longitudinally extending rows. An ejector mechanism 20 of conventional construction is hingedly attached to the header 12 for ease of ejection of the socket assembly 14. The socket assembly 14 comprises, briefly, a socket 22 and one or more electric packages such as packages 24 and 26. Packages 24 and 26 are integrated circuits (ICs) such as EPROMs and are configured in a manner of a dual-in-line package having two substantially parallel rows of conductive leads projecting from a package housing. While electronic components such as EPROMs are described, it should be understood that electric packages such as resistor networks or capacitive components may also be utilized with the present invention.

Figure 2:
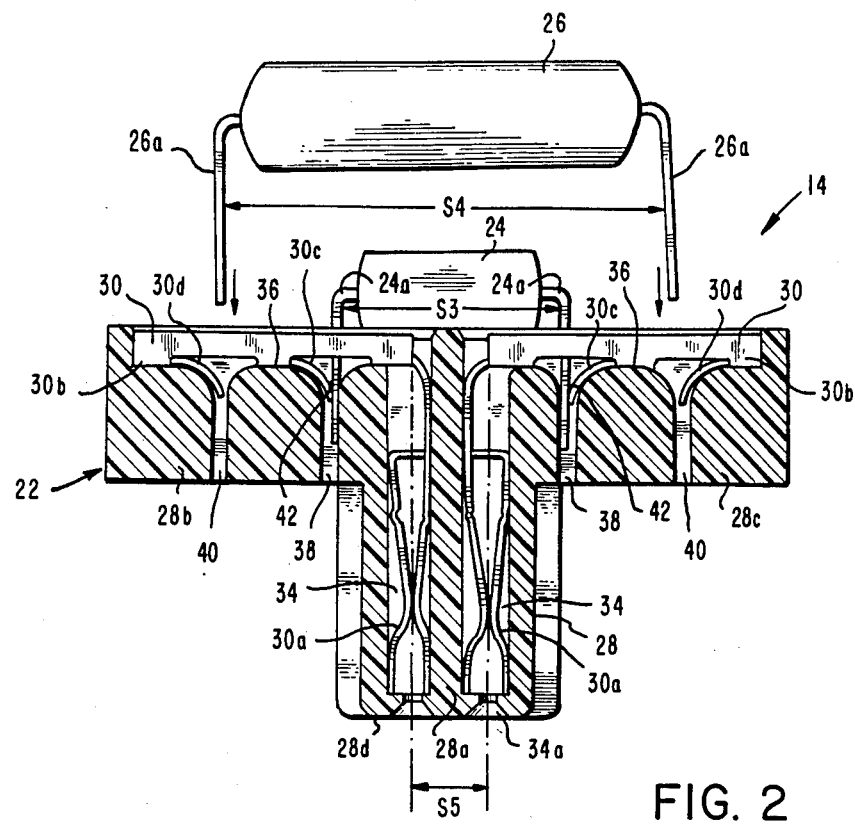
FIG. 2 is a sectional view of the socket assembly of FIG. 1 with one of the electric packages shown in disassembled condition for illustrative purposes.
Figure 3:
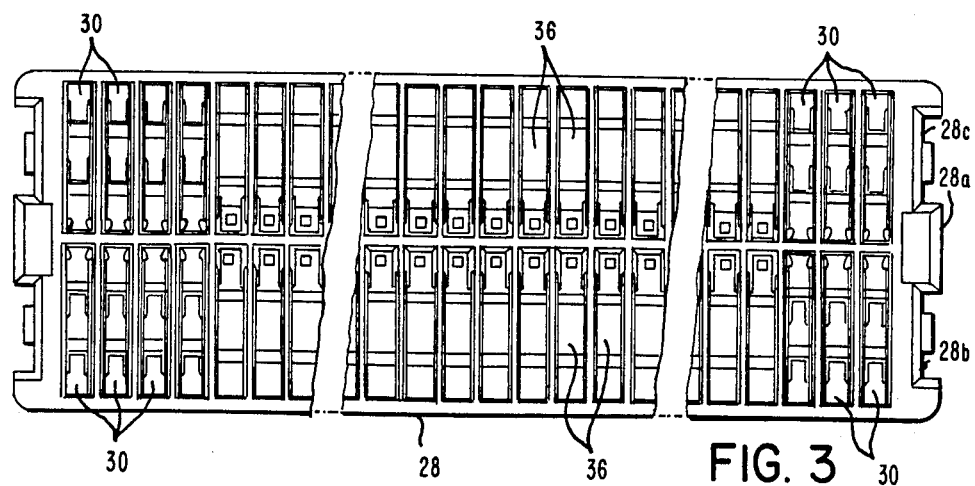
FIGS. 3 and 4 are top and bottom plan views respectively of the socket housing of the present invention.
Figure 4:
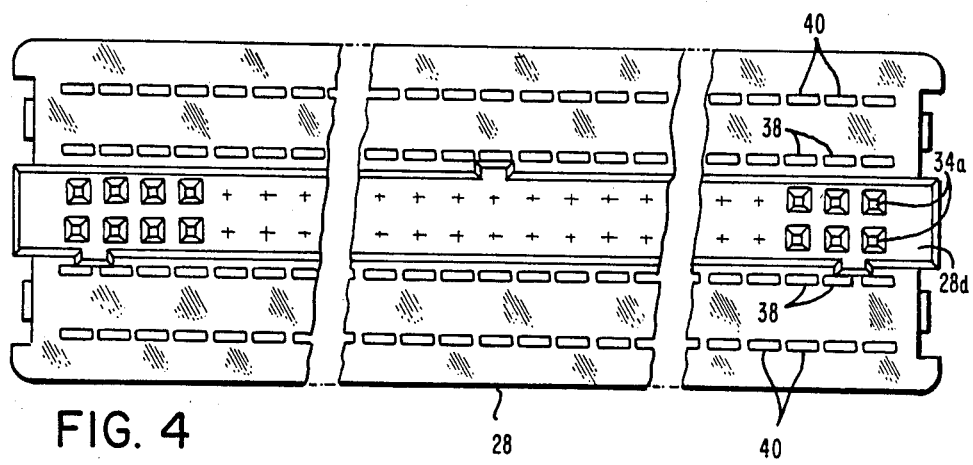

Turning now to FIGS. 2-4, the details of the socket 22 are described and illustrated. Socket 22 comprises an elongate insulative body or housing 28 having a central portion 28a and two laterally projecting portions 28b and 28c as depicted in FIG. 2. As illustrated in the view of FIG. 2, the cross-section of the housing 28 is generally T-shaped. A plurality of substantially identical electrically conductive contacts 30 are supportd by the housing 28 in separate, insulated manner in two laterally spaced, longitudinally extending rows, as shown in FIGS. 2 and 3. In such arrangement, the contacts 30 in each row are in corresponding longitudinal position defining a plurality of pairs of longitudinally extending contacts. Each of the contacts comprises a first end portion 30a and a second end portion 30b, the preferred construction of such contact 30 being integrally formed from a sheet of conductive material, such as a copper-nickel alloy, by a conventional stamping technique. The contacts 30, as so formed in self-sustained construction, are thereafter assembled to the housing 28 to form the socket 22. The first end portions 30a are disposed in apertures 34 that extend through the central portions 28a of the housing 28. The contact end portions 30a, as shown in FIG. 2, comprise a socket-type construction for receipt of a pin or other projecting member therein. The end portions 30a extend adjacent a bottom wall 28d through which openings 34a communicate with the aperture 34. Accordingly, pins such as those pins 18 shown in the header 12 of FIG. 1, may be introduced through the openings 34a for receipt and connection to the contact end portions 30a. It should be appreciated that while the contact end portions 30a are shown as socket-type, the end portions 30a may also be of the pin-type for external connection to an external socket (not shown).

Figure 5:
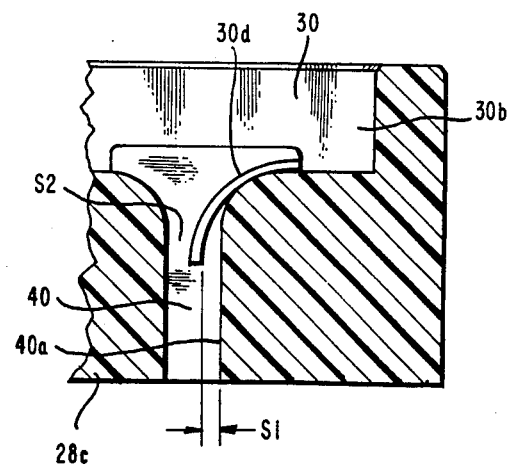
FIG. 5 is an enlarged, partially fragmented view of the rightward portion of the socket assembly of FIG. 2 to illustrate particular details of the contact members of the socket assembly.

The contact second end portions 30b extend laterally outwardly from the central housing portion 28a, each end portion 30b being supported by a respective lateral housing portion 28b and 28c in a plurality of individual recesses 36 formed in the upper portion of the housing 28. In the preferred arrangement, the contact second end portions 30b extend in a direction substantially orthogonal to the direction of the first end portions 30a. Formed in each of the contact second end portions 30b are two contact members 30c and 30d for connection to the leads of the IC, as will be described. In the configuration illustrated, contact members 30c and 30d are spaced laterally from each other, contact members 30d being more distal laterally from the central housing portion 28a than the contact members 30c. It should be understood that while each contact 30 includes two such contact members 30c, in practice, the invention is not limited thereto. In each of the housing lateral portions 28b and 28c, there are formed a plurality of openings 38 and 40, communicating individually with the recesses 36, and in registry, repectively, with the contact members 30c and 30d, the openings 38 and 40 extending through the housing portions 28b and 28c. Each of the contact members 30c and 30d is formed as a curved, cantilevered spring member, the distal unsupported end of which extends downwardly into a respective housing opening 38 or 40. As illustrated in enlarged detail in FIG. 5, the distal end of the contact members, for example 30d, are disposed in the opening 40 such that there is a spacing S1 between a wall 40a of opening 40 and the end of the contact member 30d. As such, the contact member 30d serves as a spring for biased engagement with a lead of an IC upon insertion into the socket 28 to form the socket assembly, as will be detailed. In addition, the gap S2 between the end of the contact member 30d and the opposed portion of the wall 40a of the opening 40 is preferably formed to a dimension less than that of an IC lead such that the gap S2 defines an interference opening for the lead which is resiliently expandable upon insertion of such lead.

In the socket assembly 14 as shown in FIG. 2, the packages 24 and 26 are attached to the socket 22. The lateral spacing S3 between a corresponding pair of the more interior contact members 30c is approximately equal to the lateral spacing between the leads 24a of package 24 while the lateral spacing S4 between the more exterior contact members 30d is approximately equal to the lateral spacing between the leads 26a of package 26. In actual practice, the spacing S3 may be about 0.300 inch while the spacing S4 may be about 0.600 inch. Upon insertion of the leads 24a and 26a into the socket 22, the leads initially engage the respective contact members 30c and 30d and, under the influence of the spring bias, and the resiliently constructed opening as described with reference to FIG. 5, a wiping action occurs as the leads slide past the ends of the contact members. Upon further insertion, while the spacing S1 (FIG. 5) between the contact members and the housing wall of opening 40 contracts, the contact members preferably do not engage the walls of the opening 40 and, as such, the spring bias of the contact members is retained upon completion of the package lead insertion. The package leads, for example, leads 24a as depicted in FIG. 2, are preferably soldered to the contact members 30c to form a joint 42 by a suitable technique such as vapor-phase soldering. Such soldering is readily accomplished as the contact second end portions 30b are selectively tin-plated or otherwise suitably coated and as the electric packages are typically available with pre-tinned leads.

Having decribed the details of the present invention, the particular advantages may now be understood. The soldering of the IC package leads to the contacts of the socket provides a non-detachable, permanent securement therebetween that results in a gas-tight electrical connection of high reliability and capable of withstanding severe environmental conditions. In effect, the IC package has been converted itself to a socket (or header). Additionally, the IC leads are protected from mechanical abuse which facilitates handling, storage and shipping and also provides a suitable anti-static shield for the IC. The socket assembly 14 is readily disengageable with conductors of an external electric device, such as a printed circuit board, or, as shown in FIG. 1, with the pins 18 of a header 12. Detachable connection is facilitated by selectively providing a gold-plated surface on the contacts 30 at the first end portions 30a. Such plating, which is also in a disengageable connection preferably similarly disposed on the connectable portions of the header pins 18, provides for repeated disconnection and thereby ease of replacement and repair. In the connector module 10 shown in FIG. 1, the header 12 through pins 18 may be soldered to a PCB or other component and disengageable connection of the socket assembly 14 to such header 18 is readily made by use of the ejector mechanism 20 without need of additional tools.

Figure 6:
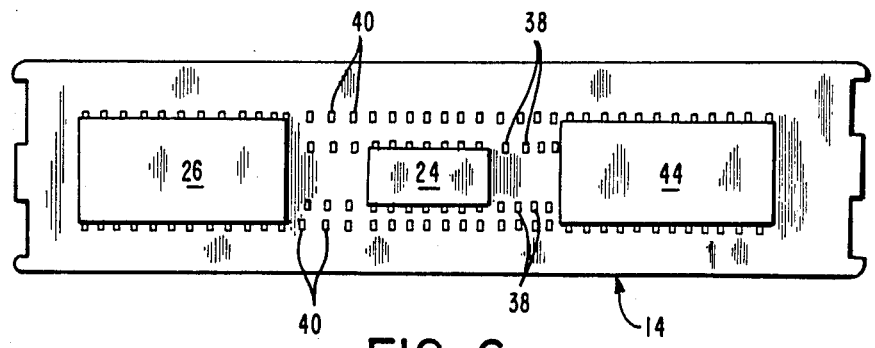
FIG. 6 is a plan view of a preferred arrangement of the socket assembly showing the interconnection of various electric packages in longitudinally spaced positions.

In another advantage of the presently described invention, selectivity of package interconnection is provided which not only enhances use of "real estate" for package density considerations, but also provides flexibility in the use of various package designs. For example, as shown in FIG. 6, the provision of two pairs of differently spaced contact members (e.g., at openings 38 defining the first pair and at openings 40 defining the second pair) at the same longitudinal position, allows for the interconnection at such longitudinal position of two packages having different laterally spaced leads or of one package or the other. As depicted in FIG. 6, package 26 may be an EPROM having leads laterally spaced at 0.600 inch while package 24 may be another IC package having leads laterally spaced at 0.300 inch. A resistor network 44 may similarly have spaced leads at 0.600 inch. While in FIG. 6, the packages are longitudinally spaced from each other, such packages, where common electrical connection is desired, may also be superimposed relative to each other as shown in FIG. 1. In FIG. 1, package 26 may be a resistor network wherein one or more of its leads are electrically connected to the same contacts 30 to which the leads of an IC package 24 are connected. Accordingly, the provision of at least two contact members 30c and 30d in the second end portion 30b of each contact allows for selective positional securement of packages to the socket for common electrical connections and/or for accommodation of ICs having different lateral spacings of leads.

In yet another advantage, the socket 22 of the presently described invention converts the spacing of the electric packages to a different spacing that may be more suitable for interconnections to PCBs or the like. For example, as indicated hereinabove, the spacing S3 may be about 0.300 inch and the spacing S4 may be about 0.600 inch. Both, or either, of these spacings are converted through the contacts 30 to a spacing S5 at which the socket assembly 14 is terminated. Spacing S5 may be about 0.100 inch. As such, connections may be made to the pins 18 of a header which are arranged in a 0.100 inch × 0.100 inch matrix.

Having described the preferred embodiment of the invention together with its attendant advantages herein, it should be appreciated that other various modifications may be made without departing from the contemplated scope of the invention. Accordingly, the particularly described preferred embodiment is intended to be illustrative and not limited thereto. The true scope of the invention is set forth in the following claims.

I claim:

1. An electrical socket for disengageable connection to conductors of an electric component comprising:

an elongate insulative housing for receiving an electric package having a plurality of conductive leads extending therefrom, said housing including a central portion having a plurality of apertures extending in spaced disposition longitudinally along the housing central portion, said housing including a lateral portion extending along said housing, two rows of openings extending longitudinally in said lateral portion, said rows of openings being laterally spaced from each other, said lateral portion having a plurality of laterally extending, longitudinally spaced recesses, each recess communicating with one opening of each row; and a plurality of conductive electrical contacts supported on said housing, each contact including a first end portion disposed in a respective one of said apertures for disengageable electrical engagement with a conductor of said electrical component and a second end portion having a projecting extent, each projecting extent lying in a respective recess in said housing lateral portion, there being on each projecting extent a pair of contact members in registry with a pair of said openings, one from each row, in said lateral portion, said contact members adapted for selective engagement with said leads of said electric package, said projecting extent of each contact second end portion comprising a generally flat surface, and said contact members each comprising a spring member biased to urge against a lead of said electric package, said spring members having been formed from said generally flat surface and being cantilevered and curved and projecting into respective ones of said openings of said housing, the unsupported distal ends of said spring members cooperating with an opposed spaced wall portion of the housing defining each opening to provide a resiliently expandable opening for receipt of one of said leads of the electric package therein.

2. An electrical socket according to claim 1, wherein said first end portions contain material thereon different from material of said second end portions and suitable for disengagement with said conductors of said electric component.

3. An electrical socket according to claim 2, wherein said material is gold and is selectively disposed on said contact first end portions.

4. An electrical socket according to claim 1, wherein said recesses are electrically insulated from each other.

5. An electrical socket according to claim 1, wherein said contact first end portions extend substantially orthogonally relative to said contact projecting extents.

6. An electrical socket according to claim 1, wherein said housing includes a further plurality of spaced apertures extending longitudinally along said housing central portion and a further lateral portion having two further rows of openings extending longitudinally therein, said further lateral portion having a further plurality of recesses, each communicating with one opening of each such further row of openings and wherein said housing supports a further plurality of conductive electrical contacts each having a first end portion disposed in a respective further aperture and a second end portion having a projecting extend lying in a respective further recess, there being on each projecting extent of said further contacts a pair of contact members in registry with a pair of such further openings, one from each row of further openings.

7. An electrical socket according to claim 6, wherein said housing central portion depends from said housing lateral portions defining therewith a housing cross-section of generally T-shape, said central portion adapted for connection with a header device comprising said conductors.

* * * * *